United States Patent
Hale

(10) Patent No.: US 10,073,612 B1
(45) Date of Patent: Sep. 11, 2018

(54) FIXED CURSOR INPUT INTERFACE FOR A COMPUTER AIDED DESIGN APPLICATION EXECUTING ON A TOUCH SCREEN DEVICE

(71) Applicant: Bentley Systems, Incorporated, Exton, PA (US)

(72) Inventor: Matthew E. Hale, Crestwood, KY (US)

(73) Assignee: Bentley Systems, Incorporated, Exton, PA (US)

( * ) Notice: Subject to any disclaimer, the term of this patent is extended or adjusted under 35 U.S.C. 154(b) by 413 days.

(21) Appl. No.: 14/828,100

(22) Filed: Aug. 17, 2015

(51) Int. Cl.
*G06F 3/048* (2013.01)
*G06F 3/0488* (2013.01)
*G06F 3/041* (2006.01)
*G06F 3/0484* (2013.01)
*G06T 11/20* (2006.01)
*G06F 3/0485* (2013.01)

(52) U.S. Cl.
CPC ............ *G06F 3/0488* (2013.01); *G06F 3/041* (2013.01); *G06F 3/0485* (2013.01); *G06F 3/04842* (2013.01); *G06F 3/04845* (2013.01); *G06T 11/203* (2013.01)

(58) Field of Classification Search
None
See application file for complete search history.

(56) References Cited

U.S. PATENT DOCUMENTS

| | | | |
|---|---|---|---|
| 5,461,709 A * | 10/1995 | Brown | G06F 3/04845 345/419 |
| 6,396,941 B1 * | 5/2002 | Bacus | G01N 1/312 382/128 |
| 6,798,429 B2 | 9/2004 | Bradski | |
| 7,870,496 B1 * | 1/2011 | Sherwani | H04L 67/38 715/718 |
| 8,106,926 B2 | 1/2012 | Zipnick | |

(Continued)

FOREIGN PATENT DOCUMENTS

EP   0172368 A2   2/1986

OTHER PUBLICATIONS

Henrysson, Anders, et al., "Virtual Object manipulation Using a Mobile Phone," Proceedings of the 2005 International Conference on Augmented Tele-existence, ACM, 2005, pp. 1-8.

(Continued)

*Primary Examiner* — Kevin L Young
*Assistant Examiner* — Haimei Jiang
(74) *Attorney, Agent, or Firm* — Cesari and McKenna, LLP; James A. Blanchette

(57) ABSTRACT

In one embodiment, a technique is provided for using a fixed cursor input interface to interact with a model of a computer aided design (CAD) application on an electronic device having a touch screen display. A view of the model is displayed within a workspace of the CAD application on the touch screen display. A fixed cursor and a toolbar are also displayed on the touch screen display. In response to the touch input within the workspace, a pan or move may be performed within model space to change the view of the model, while the fixed cursor is maintained at a designated position (e.g., the center of the touch screen display). In response to input upon an interface element of the toolbar that represents an input type, an action is performed related to a position in model space superposed by the fixed cursor.

20 Claims, 6 Drawing Sheets

(56) References Cited

U.S. PATENT DOCUMENTS

| | | | |
|---|---|---|---|
| 8,441,441 B2 | 3/2013 | Tsai et al. | |
| 2003/0206169 A1* | 11/2003 | Springer | G06F 3/04845 345/442 |
| 2004/0101206 A1* | 5/2004 | Morimoto | G06F 3/0481 382/254 |
| 2007/0100492 A1* | 5/2007 | Idaka | G05B 19/4086 700/166 |
| 2007/0273655 A1* | 11/2007 | Yeh | G08C 17/02 345/169 |
| 2009/0100366 A1* | 4/2009 | Fitzmaurice | G06F 3/04815 715/767 |
| 2012/0046071 A1 | 2/2012 | Brandis et al. | |
| 2013/0106693 A1* | 5/2013 | Okuyama | G06F 3/0482 345/157 |
| 2014/0049557 A1 | 2/2014 | Hou et al. | |
| 2015/0077348 A1* | 3/2015 | Edwards | G06F 3/041 345/173 |

OTHER PUBLICATIONS

Rohs, Michael, et al., "A Conceptual Framework for Camera Phone-based Interaction Techniques," Pervasive Computing, Springer Berlin Heidelberg, 2005, 171-189.

Schwarten, Lasse, et al., "A Comparison of Motion and Keypad Interaction for Fine Manipulation on Mobile Devices," Proceedings of the 22nd British HCI Group Annual Conference on People and Computers: Culture, Creativity, Interaction—vol. 2, British Computer Society, 2008, pp. 93-96.

U.S. Appl. No. 14/164,516, filed Jan. 27, 2014 by Daniel V. East, et al. for Virtual Mouse for a Touch Screen Device, pp. 1-31.

* cited by examiner

FIXED CURSOR INPUT INTERFACE FOR A COMPUTER AIDED DESIGN APPLICATION EXECUTING ON A TOUCH SCREEN DEVICE

BACKGROUND

Technical Field

The present disclosure relates generally to user interaction with a computer aided design (CAD) application, and a more specifically to selecting elements or points of a model in a CAD application executing on an electronic device having a touch screen display.

Background Information

Touch screen displays are becoming increasingly common on a variety of types of electronic devices. For example, most mobile devices (e.g., smartphones, tablet computers, etc.) employ some form of touch screen display, and use touch input as their primary mode of user input. By its very nature, touch input may be quick and intuitive, making it well suited for many types of applications. However, for other types of applications touch input may be less than ideal. One type of application for which touch input may be problematic is computer aided design (CAD) applications. In CAD applications, a user may be called upon to interact with elements or points of a model in a very detailed and precise manner. However, in its native form, touch input lacks the level of detail and precision provided by a traditional keyboard and mouse.

The lack of detail and precision in touch based input stems from a variety of sources. One source is the reduced number of input types that are possible with touch based input, as compared to keyboard and mouse based input. With a keyboard and mouse, a user may enter a large number of distinct types of input, using the movement sensor of the mouse, the various buttons on the mouse, the scroll wheel of the mouse, and the various keys of the keyboard, alone, or in combinations. Each of these distinct types of input can be directly mapped to types of actions in the CAD application. However, with touch based input, a user generally has fewer types of input they may enter, being limited to movements recognized on the touch screen display. For example, while a user may tap, hold, pinch, drag, swipe, etc., on the touch screen display, there are a fairly limited number of different things the user can do. This may pose a problem when designing a user interface for a CAD application. While a designer may desire to directly map a variety of actions a user can perform in the CAD application to distinct types of input, there may simply be more actions than input types.

Another source of the lack of detail and precision stems from the typical lack of persistent position tracking on touch screen displays. With a typical keyboard and mouse based user interface, a cursor is persistently displayed to designate a position. Even if the user is not moving the mouse, the cursor is still shown, and its lingering presence help the user understand a portion of the model that is available for selection or can be used to trigger actions. For example, a "hover over" may be detected, where the cursor is maintained over an object for a short period of time. This may trigger an action, such as the display of "tool tips" or real-time information. However, this type of interaction is typically not available when a CAD application is executed on an electronic device that utilizes a touch screen display as its primary input device. Traditionally, on touch screen displays, position is only designated momentarily, when a user touches the screen. As such, a persistent cursor and interactions such as "hover overs" are generally not available.

Still another source of the lack of detail and precision stems from ambiguity in position designation on touch screen displays. With a mouse, a user can generally select a single pixel in a user interface. A user can see the cursor, and move it to exactly where they desire, making tiny adjustments as needed. However, with a touch screen display, this type of operation is generally not possible. When a user touches the screen, their finger (or the stylus, if one is used) typically obscures their view of the position they are trying to designate. The position is somewhere under their finger (or the stylus tip), but the user cannot generally see where. Further, the entire area of contact is generally registered as being touched, rather than a distinct point. Algorithms may be employed to try to guess where in this area the user really intended to designate. This can be particularly problematic when a user is trying to interact with elements or points of a model in a CAD application, which may be located quite close together. A user may have to repeatedly touch the display screen, until they happen upon the desired element or point. Some attempts have been made to address this issue, for example, by imposing a local magnifier or other user interface feature to try to show the user what would normally be obscured under their finger press. However, these imposed user interface features may block some of the view of the model causing issues, and may have difficulty operating toward the edges of the screen.

Accordingly, there is a need for improved techniques for interacting with a model in a CAD application executing on an electronic device having a touch screen display.

SUMMARY

In one embodiment, a fixed cursor input interface is provided for interacting with a model in a CAD application executing on an electronic device having a touch screen display. The CAD application may display a view of the model in a workspace. The fixed cursor input interface, when activated, superposes a fixed cursor (e.g., represented as a crosshairs) upon the view of the model in the workspace and displays a separate toolbar (e.g., adjacent to the workspace) that includes interface elements (e.g., icons) that represent various input types (e.g., left mouse button press, right mouse button press, middle mouse button press, etc.).

The fixed cursor may be maintained at a designated position relative to the boundaries of the touch screen display (e.g., at the center of the touch screen display) or other independent reference, despite changes to the view of the model. The CAD application may map touch input (e.g., a gesture, such as a touch and drag) received in the workspace to a change in the view of the model (e.g. to a pan or move within model space). Yet, while the view of the model may be changed, the fixed cursor is maintained at its designated position, such that it becomes superposed over different positions in model space.

Absent other user input, the position in model space superposed by the fixed cursor may be used in connection with a "hover over" function. For example, the CAD application may use the position of the fixed cursor in model space to provide "tool tips" or real-time information describing an available snap point or closest element. The position of the fixed cursor in model space may also be used in connection with input in the toolbar. Selection of an interface element (e.g., icon) in the toolbar (e.g., that represents a left mouse button press, a right mouse button press, or a middle mouse button press, etc.) may trigger an action associated with the position superposed by the fixed cursor (e.g., a left mouse button to select a point or element at the position, a right mouse button to reset a selection, a middle mouse button to enter a tentative snap at the position, etc.) Actions may be chained together to perform CAD operations that modify the model (e.g., to draw a segment line or otherwise add to or modify the model).

It should be understood that a fixed cursor input interface may include a variety of additional or alternative features, which provide additional or alternative advantages. This Summary is intended simply as an introduction to the reader, and does not indicate or imply that the features mentioned herein cover all aspects of the invention, or are necessary or essential aspects of the invention.

BRIEF DESCRIPTION OF THE DRAWINGS

The detailed description below refers to the accompanying drawings of example embodiments, of which.

DETAILED DESCRIPTION

Figure 1:
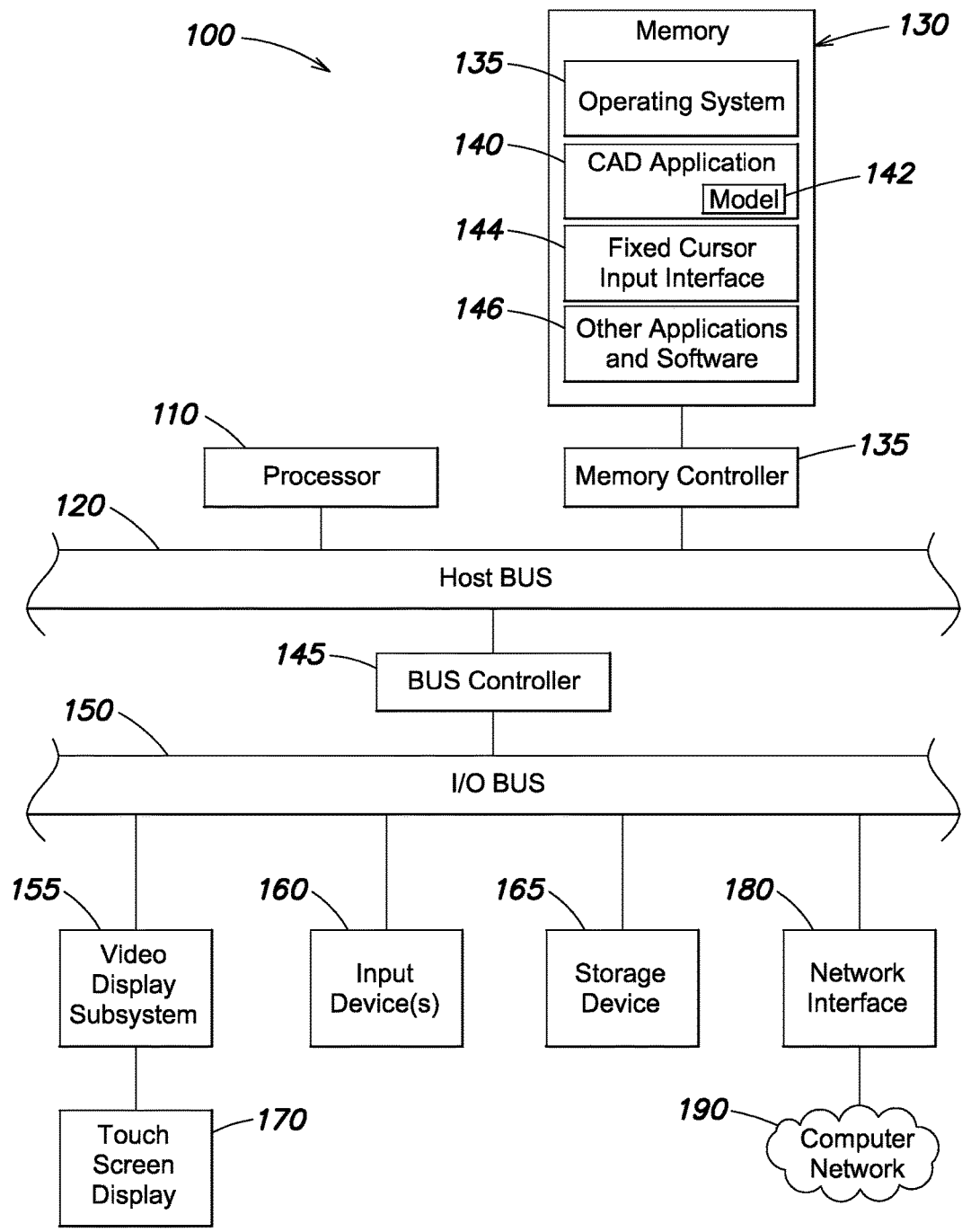
FIG. 1 is a block diagram of an example electronic device, for example, a mobile device, on which a fixed cursor input interface may be implemented.

FIG. 1 is a block diagram of an example electronic device 100, for example, a mobile device, on which the fixed cursor input interface may be implemented. As used herein, the term "mobile device" refers to a computing device that is adapted to be transported on one's person. Devices such as tablet computers and smartphones are generally considered mobile devices. Devices such as desktop computers are generally not considered mobile devices. The electronic device (e.g., mobile device) 100 may include at least one processor 110 coupled to a host bus 120. A volatile memory 130, such as a random access memory (RAM), may be coupled to the host bus 120 via a memory controller 125. The memory 130 may store at least a portion of executable instructions for an operating system 135 (e.g., an Android® or iOS® operating system), a CAD application 140, a model 142 used with the CAD application 140, a fixed cursor input interface process 144, as well as other applications and software 146. The CAD application 140 may be any of a variety of types of model creation, viewing and/or analysis application. In one implementation, the CAD application may be the Bentley® Navigator V8i application, available from Bentley Systems, Inc. The model 142 may be a two-dimensional (2-D) or (3-D) model composed of elements and/or points arranged in model space (i.e., space defined by a coordinate system of the model). The fixed cursor input interface process 144 may also take various forms. In one implementation, the fixed cursor input interface process 144 may be a software process separate from the CAD application 140, which provides event data thereto. Alternatively, the fixed cursor input interface process 144 may be software process internal to the CAD application 140.

The host bus 120 of the electronic device 100 may be coupled to an input/output (I/O) bus 150 through a bus controller 145. A video display subsystem 155 that includes a touch screen display 170 may be coupled to the I/O bus 150. The touch screen display 170 may show a user interface of the CAD application 140 as well as user interfaces of the other applications and software 146 resident on the electronic device 100. The display 170 may be designed to receive touch input from a user (e.g., via their finger(s) and/or a stylus), including single-touch gestures (involving one point of contact with the touch screen display) and/or multi-touch gestures (involving multiple points of contact with the touch screen display).

In addition to the touch screen display 170, one or more other types of input devices 160 may be included in mobile device 100 and coupled to the I/O bus 150. For example, various physical buttons or sensors (e.g., an orientation sensor, a camera, etc.) may be included. A persistent storage device 165, such as a solid-state drive, flash memory, or other type or persistent data store, may be coupled to the I/O bus 150, and used to persistently store executable instructions that are loaded into the volatile memory 130 when needed. For example, executable instructions for the operating system 135, CAD application 140, fixed cursor input interface process 144, and other applications and software 146 may be stored, and then loaded when needed. The I/O bus 150 may also be coupled to a network interface 180, for example, a wireless network interface, which interfaces with a computer network 190. The computer network 190 may allow communication between the electronic device 100 and other electronic devices, using any of a number of well known networking protocols, to permit a variety of distributed, collaborative or remote computing configurations. It should be understood that, according to such configurations, some, or all, of the software shown resident in memory 130 or stored on storage device 165 may be remotely located on a another electronic device, and interoperated with via the computer network 190.

In operation, the CAD application 140 may display a view of the model 142 in a workspace portion of its user interface on the touch screen display 170. The view of the model 142 may take any of a variety of forms, for example, an elevation, plan view, perspective views, etc., which visually represents at least some elements and/or points defined by the model 142. When activated, the fixed cursor user interface process 144 may cause a fixed cursor to be superposed upon the view of the model 142, and maintained at a designated position relative to the boundaries of the touch screen display 170 (e.g., at the center of the touch screen display) or another reference independent from the model (e.g., relative to the boundaries of the workspace). The fixed cursor user interface process 144 may also cause a toolbar to be displayed, e.g., at a location separate from the workspace. The toolbar includes interface elements (e.g., icons) that represent input types (e.g., left, right, and middle mouse button presses) for use with the fixed cursor. The CAD application 140 may allow a user to change the view of the model (e.g., to a pan or move within model space to view the model or portions thereof from different perspectives), while the fixed cursor is maintained at its designated position. In such manner, the fixed cursor may become superposed over different positions in model space, effectively "moving" in model space. A user may interact with the positions superposed by the fixed cursor (or elements or points associated with those positions) by selecting the interface elements (e.g., icons) in the toolbar corresponding to desired input types.

As explained in more detail below, in some implementations the fixed cursor input interface process 144 may interact with application program interfaces (APIs) and objects of the operating system 135 in order to detect user input on the touch screen, and then populate operating system user interface objects with processed event data used to implement the fixed cursor input interface. The CAD application 140 may simply use the processed event data provided. In an example where the operating system 135 is a Android® operating system, the APIs used may include the Android.View API (an API that exposes user interface classes that handle screen layout and interaction with the user), and the operating system user interface objects may include the Android.View.MotionEvent object (an object that is used to report input device movement) and the Android.View.TouchEvent (an object that is used to report input device button presses), among other APIs and objects. Alternatively, in other implantations the fixed cursor input interface process 144 may rely upon the CAD application 140 to process touch input according to a fixed cursor control scheme. In such an implementation, the fixed cursor input interface process 144 may simply inform the CAD application 140 that a designated position on the touch screen display 170 (e.g., the center of the touch screen display) should be used as an input location, and the CAD application 140 itself may perform the appropriate processing.

FIGS. 2-5 are a progression of screen shots 200, 300, 400, 500 from an electronic device having a touch screen display, illustrating an example use a fixed cursor user interface. In this example, the operation is to draw a line segment in a model, and may be composed of actions to select starting and ending points. However, it should be understood that the fixed cursor user interface may be used to perform a variety of other types of actions related to one or more selected positions in model space, and elements or points of the model related to those positions. The actions may include providing a "tool tip" or real-time information associated with a position (e.g., describing an available snap point, closest element or other aspect of the model), selecting element or points, drawing complex shapes, manipulating the orientation of model elements, or other types of operations.

Figure 2:
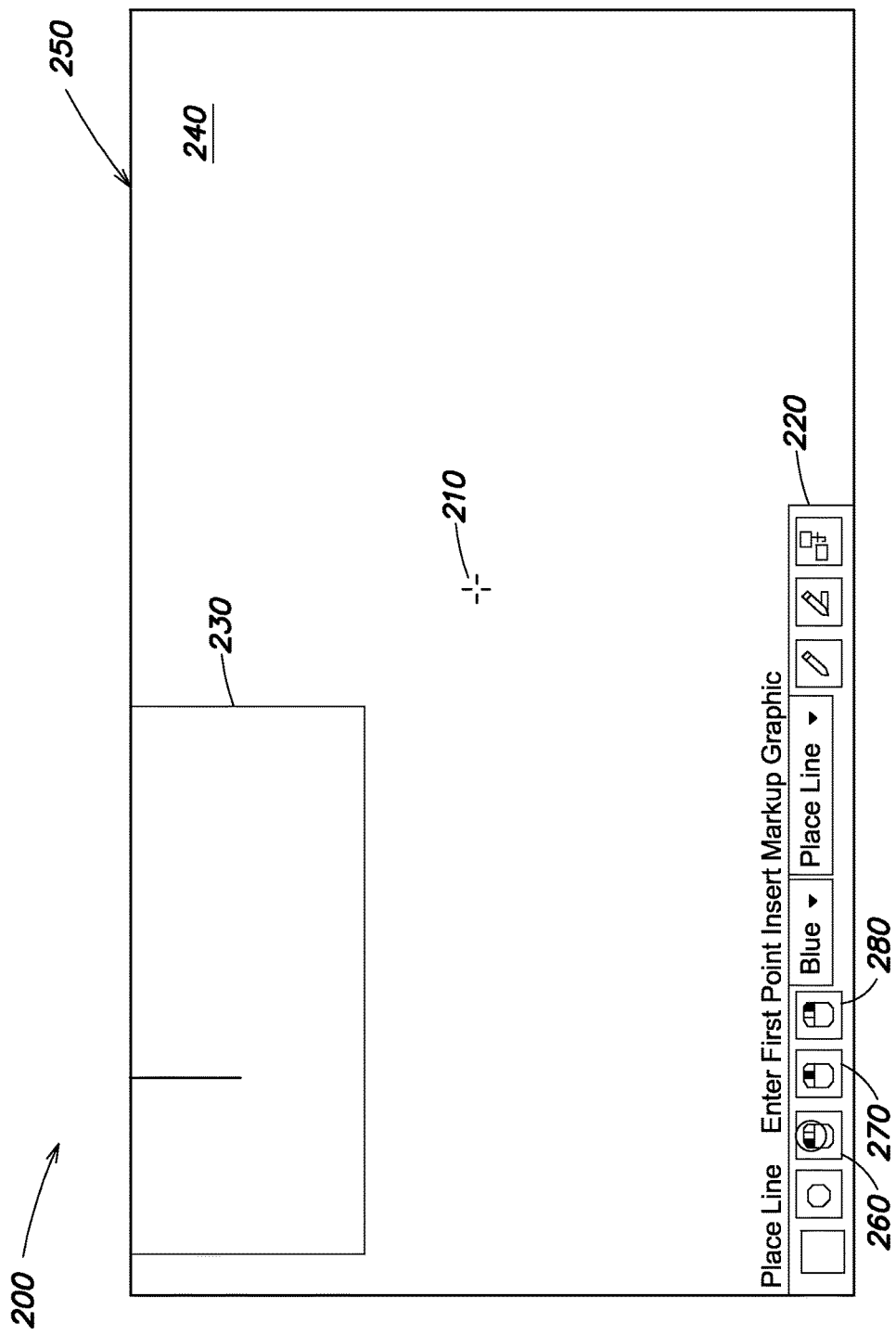
FIGS. 2-5 are a progression of screen shots from an electronic device having a touch screen display, illustrating an example use of a fixed cursor user interface.

Referring to FIG. 2, an initial view 230 of the model is displayed within a workspace 240 of the CAD application. A fixed cursor 210 is displayed centered relative to the boundaries 250 of the touch screen display. Below the workspace 240, a toolbar 220 including interface elements (e.g., icons) 260-280 corresponding to left, right, middle mouse button presses is provided. To begin drawing a line segment in the model, a user may touch the touch screen display above the interface element 260 that represents a left mouse button press. In response to the touch input, the current position in model space over which the fixed cursor 210 is superposed is selected as a first point for the line segment.

Figure 3:
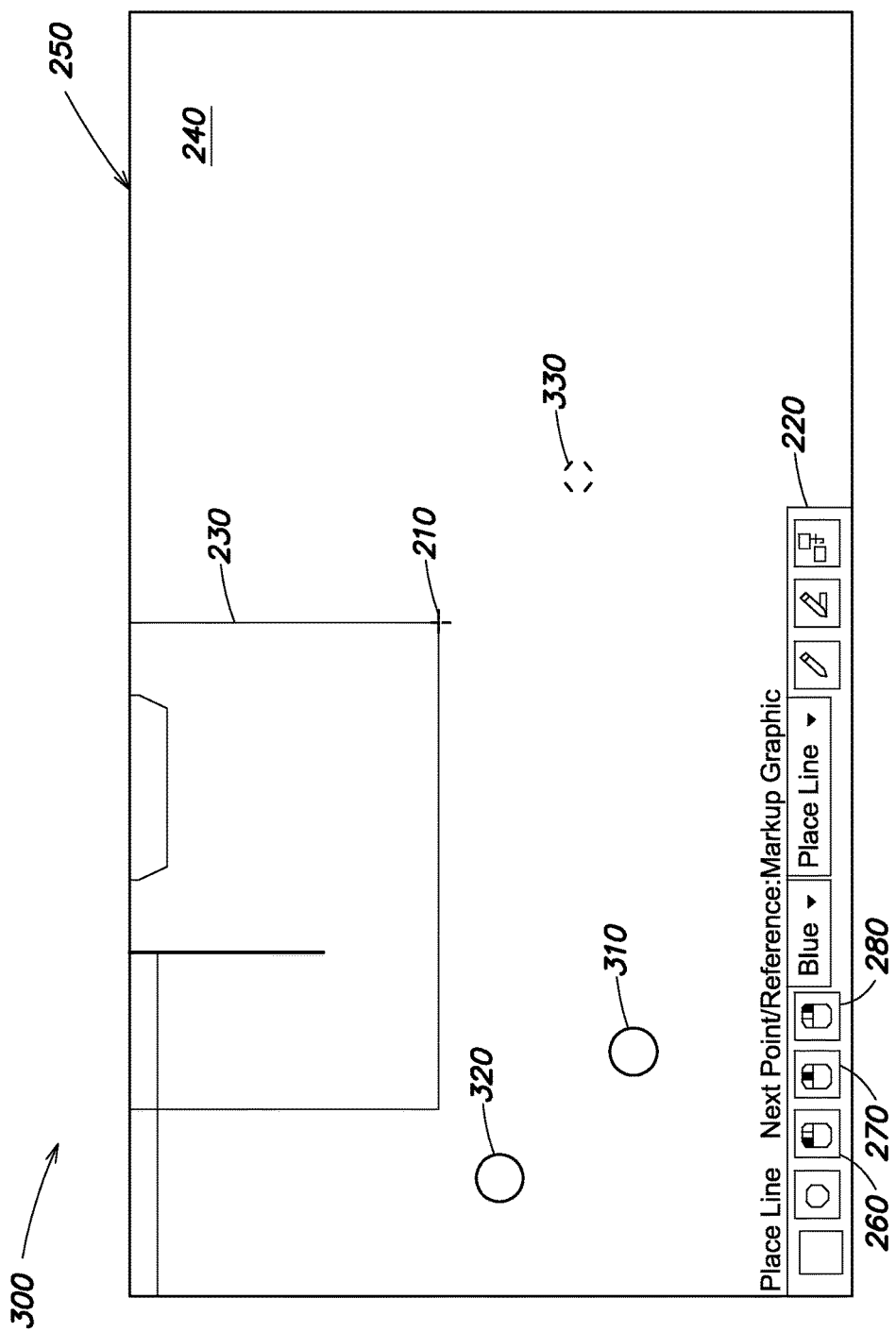
Figure 4:
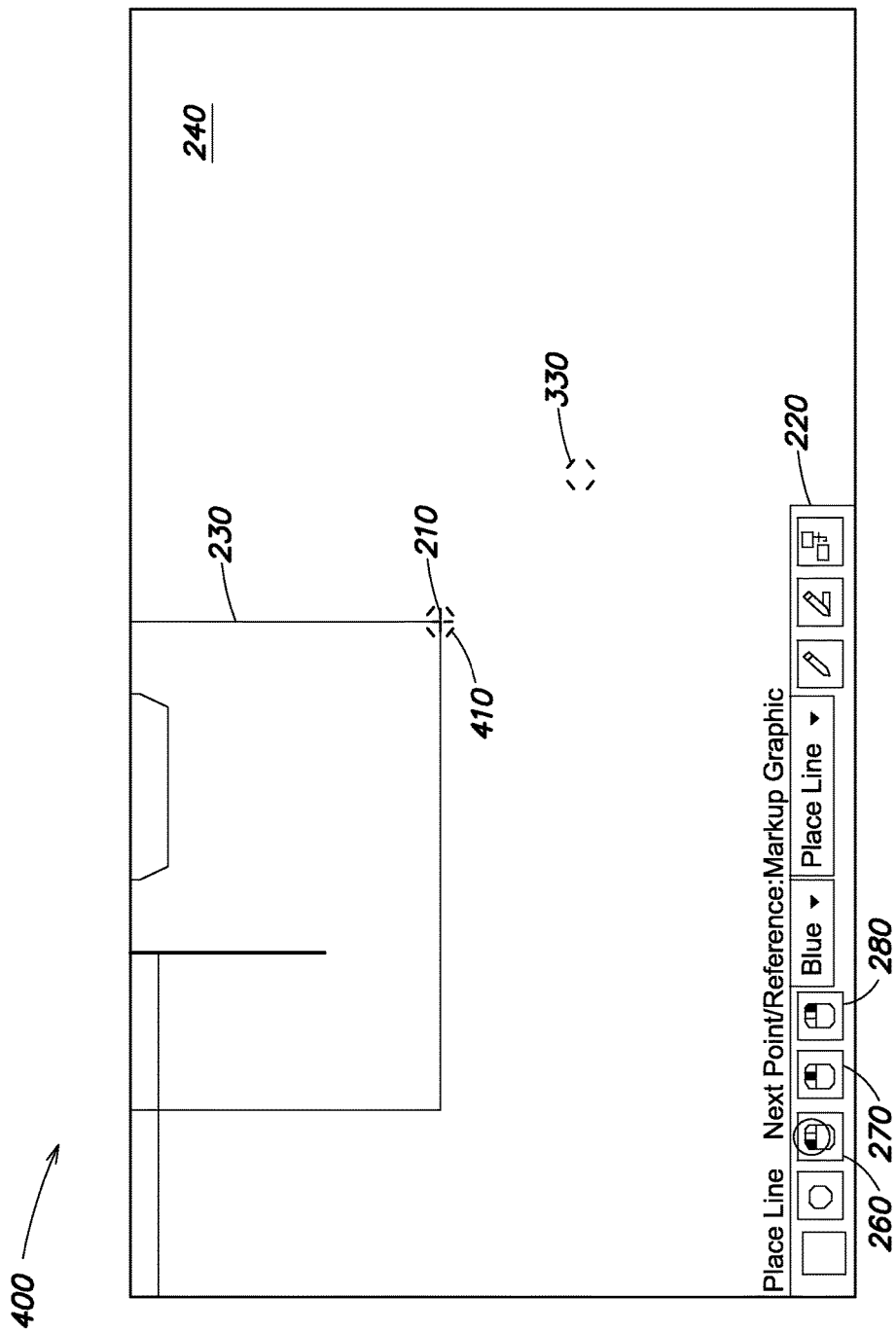

Referring to FIG. 3, the select a first point 330 is shown with highlighting. The user may touch and drag on the touch screen display from area 310 to 320 to move within model space. In response to the gesture, an updated view 230 of the model is displayed within the workspace 240, reflecting the appearance of the model from another perspective in model space. Since the fixed cursor 210 is maintained in the same position relative to the boundaries 250 of the touch screen display, it is effectively "moved" within model space to become superposed over a new position in model space (in this example a position corresponding to the edge of an element of the model).

Referring to FIG. 4, the user may again touch the touch screen display above the interface element 260 that represents a left mouse button press. In response to the touch input, the new position in model space over which the fixed cursor 210 is superposed is selected, now as a second point 410.

Figure 5:
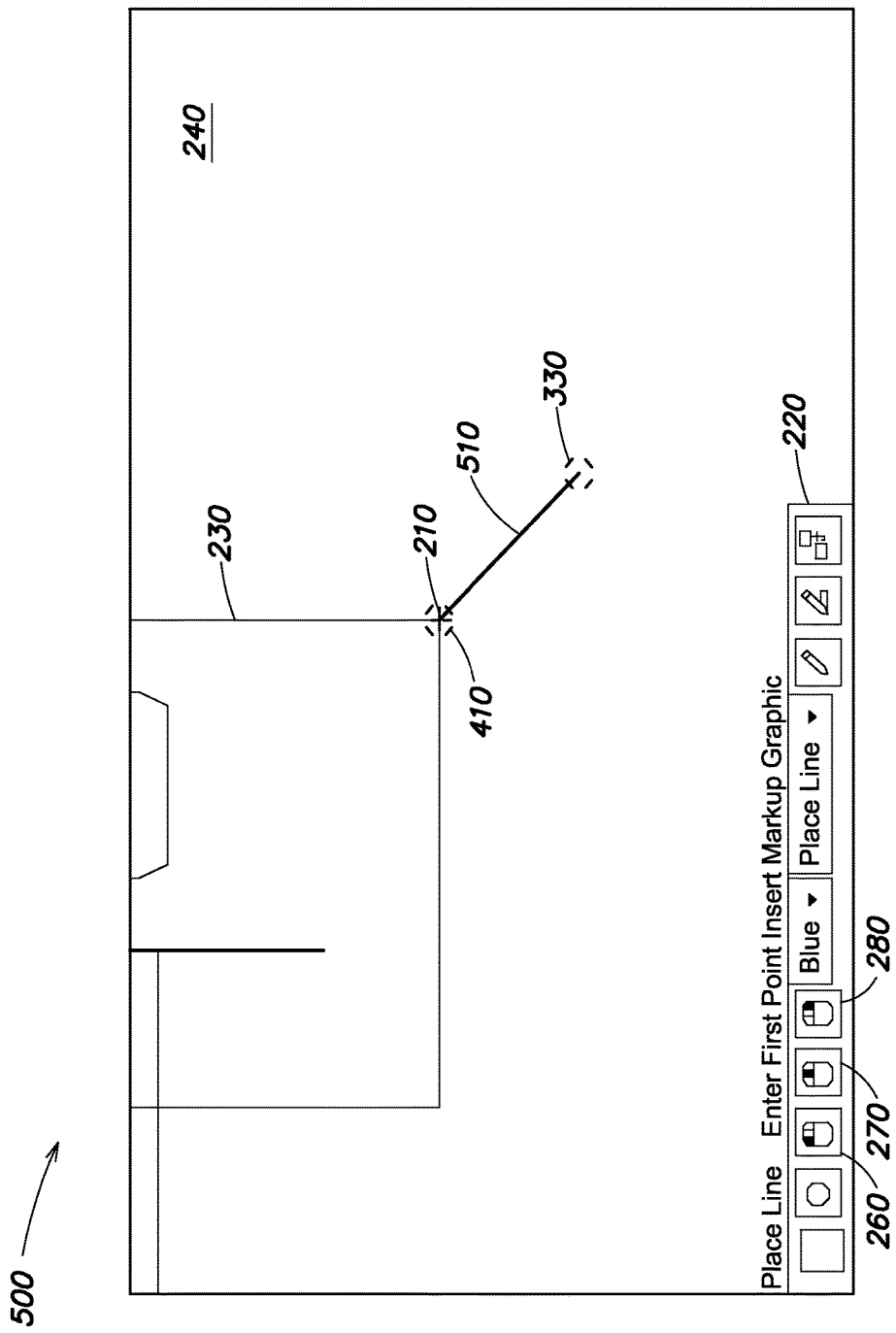

Referring to FIG. 5, the CAD application adds a line segment 510 to the model between the first point 330 and the second point 410, and displays the line segment 510 as part of the view 230 shown in the workspace 240.

Figure 6:
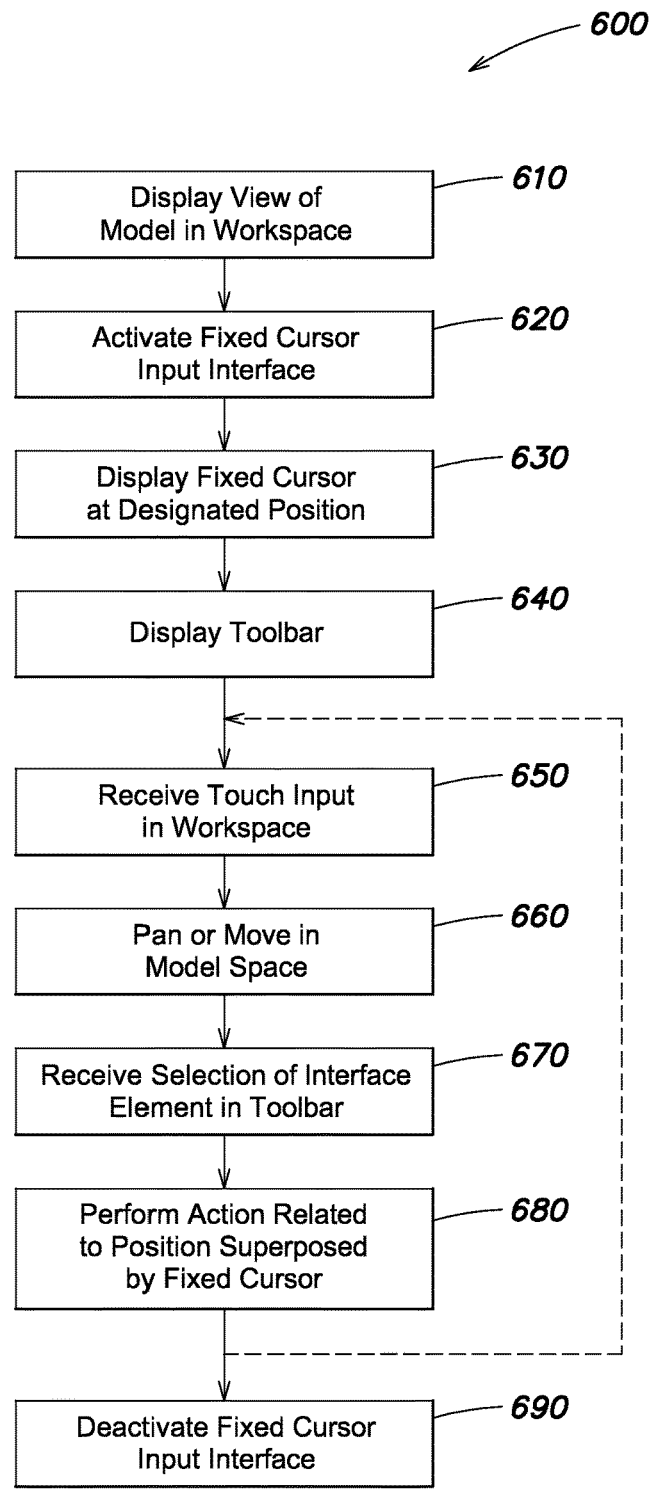
FIG. 6 is a flow diagram of a sequence of steps that may be used to implement a fixed cursor input interface.

FIG. 6 is a flow diagram of a sequence of steps 600 that may be used to implement a fixed cursor input interface. At step 610, the CAD application displays a view of the model in the workspace on the touch screen display. At step 620, a fixed cursor input interface may be activated. In response thereto, at step 630, the fixed cursor input interface process causes a fixed cursor to be displayed at a designated position relative to a reference independent from the view of the model (e.g., centered relative to the boundaries of the touch screen display). The fixed cursor is initially superposed over a first position in model space. At step 640, the fixed cursor input interface process causes a separate toolbar to be displayed (e.g., adjacent to the workspace). The toolbar may include a plurality of interface elements that represent input types for use with the fixed cursor. At step 650, touch input is received on the touch screen display within the workspace of the CAD application. At step 660, in response to the touch input, the CAD application performs a pan or move within model space to change the view of the model, while maintaining the fixed cursor at the designated position relative to the reference independent from the view of the model. At step 670, a selection of an interface element of the toolbar is received. At step 680, the fixed cursor input process causes the CAD application to perform an action related to the position in model space superposed by the fixed cursor. For example, if the interface element corresponds to a left mouse button press, the action may be to select a point or element associated with the position. If the interface element corresponds to a right mouse button press, the action may be to reset a selection. Likewise, if the interface element corresponds to a middle mouse button press, the action may be to enter a tentative snap. Actions may be chained together to perform CAD operations that modify the model, and in such cases step 650-680 may be repeated. For example, if the operation is to draw a new line segment in the model, a first iteration through steps 650-680 may select a first point to start the line segment, while a second iteration through steps 650-680 may select a second point to end the line segment. The sequence of steps 600 may terminate at step 690, where the fixed cursor input interface is deactivated.

In more detail, to cause the CAD application to perform the actions of step 680, the fixed cursor input interface process may perform various operations. In a first implementation, the fixed cursor input interface process may populate operating system user interface objects with processed event data. In an example where the operating system is a Android® operating system, in response to touch input being received upon an interface element (e.g., representing a left mouse button press) of the toolbar, the fixed cursor input interface process may interact with the Android.View API to create a MotionEvent object indicating the input device has moved to the designated position (e.g., the center of the touch screen display), despite the actual location of a user's touch upon the screen. The fixed cursor input interface process may further interact with the Android.View API to call the onTouchEvent method, and to cause the next TouchEvent to be treated like a data point. For example, the following code may be executed:

```
    private void sendButtonPress ( ) {
        final int viewWidth=m_dgnView.getWidth( );
        final int viewHeight=m_dgnView.getHeight( );
        final float x=(viewWidth/2.0f);
        float y=(viewHeight/2.0f);
    MotionEvent motionEvent=MotionEvent.obtain (SystemClock.uptimeMillis( )-100,
    SystemClock.uptimeMillis( ), MotionEvent.
        ACTION_DOWN, x, y, 0 /*metaState*/);
        m_dgnView.onTouchEvent(motionEvent);
        motionEvent.recycle( );
        motionEvent=MotionEvent.obtain(SystemClock.uptimeMillis( )-100, SystemClock.uptimeMillis( ),
            MotionEvent.ACTION_UP, x, y, 0);
        m_dgnView.onTouchEvent(motionEvent);
        motionEvent.recycle( );
        }
        public void onButtonLeft(View v) {
            sendButtonMessage (1, true);
            sendButtonPress ( );
        }
```

In such manner, the cursor input interface process may perform the processing, and the CAD application is simply fed appropriate event data.

Alternatively, in a second implementation, the fixed cursor input interface process may rely upon the CAD application to perform the needed processing. In such an implementation, the fixed cursor input interface process may simply inform the CAD application that it should use a designated position (e.g., the center of the touch screen display) on the touch screen as the corresponding location when touch input is received upon an interface element. All processing is thereafter performed by the CAD application.

While the above description discusses example techniques for providing a fixed cursor input interface for interacting with a model in a CAD application executing on an electronic device having a touch screen display, it should be understood that a number of modifications and/or additions may be made without departing from the disclosure's intended spirit and scope.

For example, while the techniques are discussed in connection with interacting with a model of a CAD application, it should be understood that a fixed cursor user interface may be adapted for use with other applications and software that may be executed on an electronic device having a touch screen display.

Further, while specific software implementations are discussed above, it should be understood that other types of software implementations may be employed. In general, such implementations may involve electronic device-executable instructions stored in/on one or more non-transitory electronic device-readable media, such as volatile or persistent memories, hard-disks, compact disk (CD), or other storage media. Further, it should be understood that the various types of hardware implementations are also possible. A hardware implementation may include specially configured processors, application specific integrated circuits (ASICs), and/or other types of hardware components. Above all, it should be understood that the above descriptions are meant to be taken only by way of example.

What is claimed is:

1. A method for using a fixed cursor input interface to interact with a model of a computer aided design (CAD) application on an electronic device having a touch screen display, comprising:
    displaying, on the touch screen display, a view of the model within a workspace of the CAD application;
    displaying, on the touch screen display, a fixed cursor at a designated position relative to a reference independent from the view of the model;
    displaying, on the touch screen display, a toolbar that includes a plurality of interface elements that represent input types;
    receiving, on the touch screen display, touch input within the workspace of the CAD application;
    in response to the touch input within the workspace, panning or moving within model space to change the view of the model, while maintaining the fixed cursor at the designated position;
    receiving, on the touch screen display, a selection of one of the interface elements that represent input types; and
    in response to receiving the selection, performing an action by the CAD application related to a position in model space superposed by the fixed cursor.

2. The method of claim 1, wherein the reference independent from the view of the model is boundaries of the touch screen display.

3. The method of claim 2, wherein the designated position is a center of the touch screen display relative to the boundaries of the touch screen display.

4. The method of claim 1, wherein the interface elements that represent input types include at least an interface element that represents a left mouse button press, a right mouse button, or a middle mouse button press.

5. The method of claim 1, wherein the action is to select a point or element.

6. The method of claim 1, wherein the action is to reset a selection.

7. The method of claim 1, wherein the action is to enter a tentative snap.

8. The method of claim 1 further comprising:
    subsequent to the performing the action, again panning or moving within model space in response to touch input within the workspace to cause the fixed cursor to be superposed over a second position in model space;
    receiving a further selection of one of the interface elements; and
    in response to receiving the further selection, performing a second action related to a second position in model space superposed by the fixed cursor.

9. The method of claim 8, wherein the action and second action together draw a line segment in the model.

10. The method of claim 1, wherein the electronic device is a mobile device.

11. An electronic device configured to provide a fixed cursor input interface to interact with a model of a computer aided design (CAD) application, comprising:
    a touch screen display that is sensitive to a user's touch;
    a processor; and
    a memory coupled to the processor and configured to store instructions for the CAD application and a fixed cursor input interface process, the instructions, when executed by the processor, being operable to:
        display, on the touch screen display, a view of the model within a workspace of the CAD application,
        display, on the touch screen display, a fixed cursor at a designated position, the designated position to remain unchanged during any panning or moving within model space to change the view of the model, display, on the touch screen display, a toolbar including a plurality of interface elements that represent input types, and in response to a selection of one of the interface elements, performing an action related to a position in model space superposed by the fixed cursor.

12. The electronic device of claim 11, wherein the interface elements that represent input types include at least an interface element that represents a left mouse button press, a right mouse button, or a middle mouse button press.

13. The electronic device of claim 11, wherein the action is to select a point or element.

14. The electronic device of claim 11, wherein the action is to reset a selection.

15. The electronic device of claim 11, wherein the action is to enter a tentative snap.

16. A non-transitory computer-readable medium that includes software executable on a processor, the software, when executed, being operable to:

display a view of a model within a workspace of a computer aided design (CAD) application on a touch screen display;

display a fixed cursor at a designated position relative to a reference independent from the view of the model on the touch screen display;

receive a first selection of an interface element on the touch screen display that represents an input type;

select a first point in model space that is superposed by the fixed cursor to start a line segment;

pan or move within model space while maintaining the fixed cursor at the designated position relative to the reference independent from the view of the model;

receive a second selection of the interface element on the touch screen display;

select a second point in model space that is superposed by the fixed cursor to end the line segment; and draw a line segment from the first point to the second point in the model.

17. The non-transitory computer-readable medium of claim 16, wherein the interface element represents a left mouse button press.

18. The non-transitory computer-readable medium of claim 16, wherein the reference independent from the view of the model is boundaries of the touch screen display.

19. The non-transitory computer-readable medium of claim 18, wherein the designated position is a center of the touch screen display relative to the boundaries of the touch screen display.

20. The non-transitory computer-readable medium of claim 16, wherein the pan or move within model space is in response to touch input within the workspace of the CAD application.

* * * * *